(12) United States Patent
Pereira et al.

(10) Patent No.: US 9,065,413 B2
(45) Date of Patent: Jun. 23, 2015

(54) METHOD AND APPARATUS FOR CIRCUIT WITH LOW IC POWER DISSIPATION AND HIGH DYNAMIC RANGE

(75) Inventors: Angelo William Pereira, Hillsboro, OR (US); Paul-Herve Aymeric Fontaine, Plano, TX (US); Michel Vercier, Chicago, IL (US); Chintan Trehan, Fairview, TX (US); Sooping Saw, The Colony, TX (US); Balaji Narendran Chellappa, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 435 days.

(21) Appl. No.: 13/443,525

(22) Filed: Apr. 10, 2012

(65) Prior Publication Data

US 2013/0188808 A1 Jul. 25, 2013

Related U.S. Application Data

(60) Provisional application No. 61/598,500, filed on Feb. 14, 2012, provisional application No. 61/590,607, filed on Jan. 25, 2012.

(51) Int. Cl.
*H03G 3/00* (2006.01)
*H03G 7/00* (2006.01)
*H03F 99/00* (2009.01)
*H03G 3/30* (2006.01)

(52) U.S. Cl.
CPC ........... *H03G 3/3005* (2013.01); *H03G 3/3089* (2013.01)

(58) Field of Classification Search
CPC ......... H03G 7/002; H03G 7/007; H03G 9/00; H03G 9/005

USPC .................................. 381/120, 107, 106, 109
See application file for complete search history.

(56) References Cited

U.S. PATENT DOCUMENTS

| | | | |
|---|---|---|---|
| 7,622,984 B2 | 11/2009 | Lesso et al. | |
| 7,714,660 B2 | 5/2010 | Lesso et al. | |
| 7,808,324 B1 | 10/2010 | Woodford et al. | |
| 2008/0044041 A1 | 2/2008 | Tucker et al. | |
| 2008/0279392 A1* | 11/2008 | Correia et al. | 381/94.1 |
| 2009/0257599 A1 | 10/2009 | Jensen et al. | |
| 2010/0215194 A1* | 8/2010 | Bhattacharya | 381/106 |
| 2011/0075861 A1 | 3/2011 | Wu et al. | |
| 2011/0084760 A1 | 4/2011 | Guo et al. | |
| 2011/0123048 A1* | 5/2011 | Wang et al. | 381/120 |
| 2012/0321104 A1* | 12/2012 | Kemmerer et al. | 381/107 |

FOREIGN PATENT DOCUMENTS

JP 2000-102098 4/2000

* cited by examiner

*Primary Examiner* — Vivian Chin
*Assistant Examiner* — Douglas Suthers
(74) *Attorney, Agent, or Firm* — Alan A.R. Cooper; Frank D. Cimino

(57) ABSTRACT

An apparatus comprises a selected volume detector that detects a selected output volume; an analog output signal amplifier; a digital volume amplifier; a boost gain control element coupled to the selected volume detector; the analog output signal amplifier; and the digital volume amplifier; wherein the boost gain control element is configured to: keep a gain of a path of the digital volume amplifier and the analog output signal amplifier substantially constant, wherein the boost gain control element can adjust both: a) a gain of the digital volume control; and b) a gain of the analog output signal amplifier; to keep the gain of the path of the digital volume amplifier and the analog output signal substantially constant and equal to the selected output volume.

18 Claims, 8 Drawing Sheets

METHOD AND APPARATUS FOR CIRCUIT WITH LOW IC POWER DISSIPATION AND HIGH DYNAMIC RANGE

PRIORITY

This Application claims priority from U.S. Provisional Patent Application No. 61/590,607, filed Jan. 25, 2012, entitled "A Method and Apparatus to Substantially Simultaneously Obtain Low Integrated Circuit Power Dissipation and High Dynamic Range", which is incorporated by reference in its entirety. This Application also claims priority from U.S. Provisional Patent Application No. 61/598,500, filed Feb. 14, 2012, entitled "A Method and Apparatus to Substantially Simultaneously Obtain Low Integrated Circuit Power Dissipation and High Dynamic Range", which is incorporated by reference in its entirety.

TECHNICAL FIELD

This Application is directed, in general, to an integrated circuit (IC) that has an audio channel that plays back audio signals encoded in any digital format compressed (such as MP3) or uncompressed (such has PCM), and more particular, to an audio channel with a low IC power dissipation and a high dynamic range (DR) is desired simultaneously.

BACKGROUND

Generally, as understood by the present inventors, state of the art audio ICs for audio playback can have several limitations that can create engineering and user trade-offs between power dissipation and signal to noise ratio (SNR) as well as dynamic range (DR). In one instance, a best in class portable audio CODEC (i.e. capable of encoding or decoding a digital data stream or signal) has reported a MPEG-1 or MPEG-2 Audio Layer III (MP3) quiescent power at 4 milliwatts, and a best SNR is 101 dB (Amplitude.) However, these parameters are not achieved simultaneously.

Figure 1:
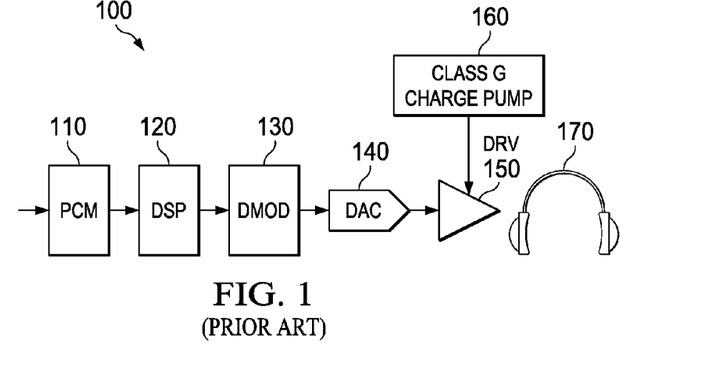
FIG. 1 illustrates a prior art DAC-headphone playback channel.

For example, turning to FIG. 1, a circuit 100, a prior art digital to analog (DAC) headphone playback channel, is illustrated. In the circuit 100, a pulse code modulation (PCM) codec 110 is coupled to a digital signal processor (DSP) 120. The DSP 130 is then oversampled at a demodulator (DMOD) 130, an output of which is coupled to an input of a digital to analog converter (ADC) 140. An analog signal of the DAC 140 is then conveyed to the driver 150, which is powered by a class "G" charge pump 160. This in turn, is used to power a pair of headphones 170.

However, as recognized by the Present Inventors, there are problems with this prior art circuit 100. Generally, the prior art circuit 100, as well as other circuits used for portable IC for an audio playback for a headphone (HP), encounter a problem of noise, be it white noise or other, within the DMOD 120, the DAC 140, and the HP 170, that forces tradeoffs between power dissipation, die size, and so on, versus a dynamic range of the circuit 100.

Certain patents do generally address power savings in a prior art circuit 100, used for portable IC for an audio playback for a headphone (HP). For example, please see U.S. Pat. No. 7,808,324 "Operating environment and process position selected charge-pump operating mode in an audio power amplifier integrated circuit" to Woodford et al, which is generally directed towards Class G efficiency, but not SNR or power of DAC, HP amp. U.S. patent application Ser. No. 11/610,496 "Energy-Efficient Consumer Device Audio Power Output Stage" to Tucker et al, is generated directed to a low power audio playback path focused on CP mode control, but no description of dynamic range improvement or power reduction occurring simultaneously. U.S. Pat. No. 7,622,984, "Charge pump circuit and methods of operation thereof" to Lesso, et al, describes charge pump circuits to generate a plurality of positive and negative outputs using a single CFLY, but simultaneous DR improvement and power reduction is not addressed. U.S. Pat. No. 7,714,660, entitled "Amplifier circuit and methods of operation thereof" to Lesso et al, which is generally directed to a charge pump and headphone amplifier circuit which is directed toward improving "efficiency", but does not address dynamic range, instead 660 is used to control CP mode of operation to track the signal amplitude. Other references are U.S. App. No. 2011/0123048 "Class G Audio Amplifiers and Associated Methods of Operation" to Wang et al, and U.S. Pat App No. 2011.0084760 A1 to Guo, et al, may be directed to class G amplifiers, but they do not address a dynamic range improvement or power reduction occurring simultaneously.

Therefore, there is a need in the art to address at least some of the issues associated with dynamic range improvement or power reduction occurring simultaneously.

SUMMARY

A first aspect provides an apparatus, comprising: a selected volume detector that detects a selected output volume; an analog output signal amplifier; a digital volume amplifier; a digital gain control element coupled to the selected volume detector; the analog output signal amplifier; and the digital volume amplifier; wherein the gain control element is configured to: keep a channel gain of a path of the digital volume amplifier and an analog output signal amplifier substantially constant, wherein the digital gain control element can adjust both: a) a gain of the digital volume amplifier; and b) a gain of the analog output signal amplifier; to keep the gain of the path of the digital volume amplifier and the analog output signal amplifier substantially constant and equal to the selected output volume designated for a suitable listening level.

A second aspect provides an apparatus, comprising: a selected volume detector that detects a selected output volume; an analog output signal amplifier; a digital volume amplifier; a gain control element coupled to a) the selected volume detector; b) the analog output signal amplifier; and the digital volume amplifier; wherein the gain control element is configured to: keep a gain of a path of the digital volume amplifier and the analog output signal amplifier substantially constant, wherein the boost gain control element can adjust both: a) a gain of the digital volume control; and b) a gain of the analog output signal amplifier; to keep the gain of the path of the digital volume amplifier and the analog output signal substantially constant and equal to the selected output volume, wherein the boost gain control element is further configured to: compare the selected output volume to a threshold value. If the selected output volume is below the threshold, then the gain control element can: a) adjust upwards a digital volume of the digital volume amplifier; and b) adjust downwards a volume of the amplifier, to keep the gain of the path of the digital volume amplifier and the analog output signal substantially constant and equal to the selected output volume.

In the second aspect, the digital gain control element in stated apparatus is adapted to adjust both a) and b) to be higher or lower in discrete steps of programmable magnitude such that the sum remains substantially constant. It is implied that the adjustment of a) and b) is complementary in direction or polarity to achieve the requirements of a substantially constant gain. The number of steps is also programmable in the apparatus. Programmability may be designed in the factory or made adjustable in the field. No explicit limits on the resolution or range of the gains are imposed by the apparatus.

In a third aspect, a method is provided determining if a selected output volume is greater than a volume threshold; increasing a gain of a digital amplifier if the selected output volume is not greater than the threshold volume; decreasing a gain of an amplifier if the selected output volume is not greater than the threshold volume; and wherein the gain of a path of the digital volume amplifier and the analog output signal substantially constant and seeks to be equal to the selected output volume.

BRIEF DESCRIPTION OF THE DRAWINGS

Reference is now made to the following descriptions.

DETAILED DESCRIPTION

Figure 2A:
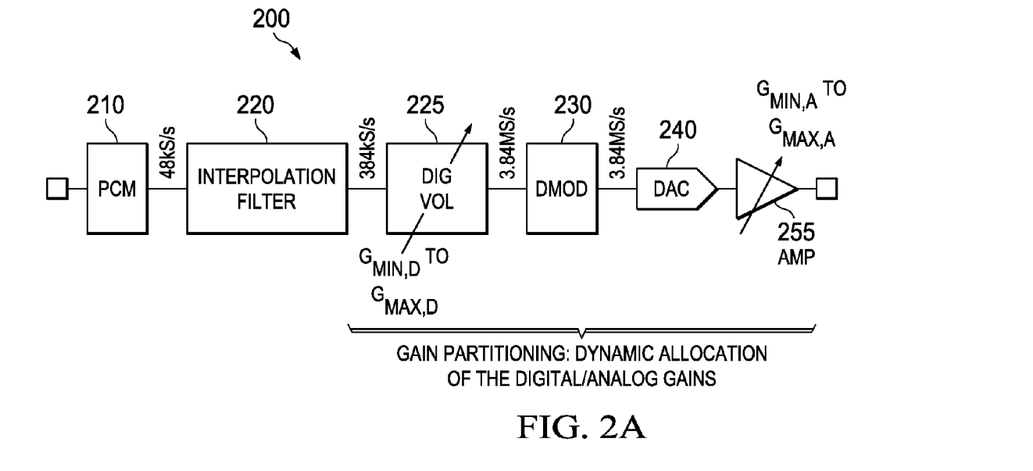
FIG. 2A illustrates a first analysis for dynamic allocation of a digital/analog gain partition of a DAC channel.

Turning to FIG. 2A, illustrated is one aspect of an example dynamic range boost circuit 200 constructed according to the principles of the present Application. In the circuit 200, a block diagram of a DAC headphone playback channel with dynamic range enhancement is illustrated.

Generally, the circuit 200 is directed towards an approach of a dynamic boost for a high dynamic range that also has a lower power dissipation occurring substantially simultaneously for a DAC headphone playback on a single IC. The headphone may be replaced by any other load such as a loudspeaker, an external audio amplification apparatus without altering the behavior of the stated apparatus.

According to the principles of the present Application, the circuit 200 uses a dynamic allocation, and in some preferred embodiments, an optimization, of a digital/analog gain partitioning of an audio signal. In other words, the circuit 200 can partition gain between a digital volume amplifier 225 and an analog amplifier 255 to nonetheless convey a selected output volume to a headphone or a listener. In other words, an absolute path gain is unchanged, and the digital/analog gain portioning is altered.

According to the principles of the present Application, partitioning the gain such that the digital gain is maximized and the analog gain is minimized reduces DMOD, DAC and Amplifier circuit noise, and therefore benefits dynamic range of the circuit 200. Additionally according to the principles of the present Application, regarding digital to analog conversion, partitioning can proceed without introduction of undesirable distortion as long as the elements DMOD, DAC and Analog Amplifier are maintained in their linear region of operation. Enhanced dynamic range using above principles can be employed within the present Application.

Generally, Dynamic range is the ratio of the signal amplitude at a designated output terminal to the totality of the noise at the same output terminal. Hence constant signal amplitude with lower noise in effect enhances dynamic range. Enhanced dynamic range provides a higher fidelity audio listening experience which is highly desirable.

The circuit 200 has a number of advantages when compared to prior art headphone drivers. The circuit 200 helps to reduce or eliminate audible artifacts. One such artifact is that, if noise is generated earlier on in an audio system, that noise is also amplified by later amplifiers. But there can be other considerations, such as relative power consumptions of various electronic elements.

However, earlier stages of a headphone driver can be more power consuming. Therefore, the circuit 200 allocates and optimizes between the digital volume amplifier 225 and the analog amplifier 255. The circuit 200 has two primary modes of operation: a "boost" mode, and a "reverse dynamic boost" ("normal") mode.

In the boost mode, when an amplitude at a driver output, such as at a headphone (HP), is under a designated digital threshold, such as −18 dBFS, a digital gain before the DAC is increased by a value $\Delta G_D$ (for example, as high as +12 dB), whereas an analog amplifier/headphone driver gain is reduced by the same amount to as low as −12 dB. Again, an absolute path gain is unchanged, yet the digital/analog gain portioning is altered. In the circuit 200, the noise of the DSP ramps up less than linearly, so while a gain of a system may be constant, the noise itself is not.

This reduces DMOD, DAC and Amp noise, and therefore benefits dynamic range of the circuit 200.

In the normal mode, when a signal stabs above the threshold, the digital gain before the DAC ramps downward, and the analog amplifier/headphone driver gain ramps up to register settings.

In the circuit 200, a PCM CODEC 210 is coupled to a digital signal processor (DSP) 120. In one example of the circuit 200, the PCM output bits at a rate of 48 kilo bits per second. The DSP 230 is then oversampled at a DMOD 220, a digital filter, which can be an eight times over-sampling, an output of which is coupled to an input of a digital to analog converter (DAC) 240. An analog signal of the DAC 240 is then conveyed to the driver 255, which is then powered by a class "G" charge pump 260. This in turn, is used to power an example pair of headphones 270.

In the circuit 200, an output of the DFILT 220, is then conveyed to a digital amplifier 255. The digital amplifier 225 can digitally amplify or de-amplify a received digital signal. In one example, a range of amplification or de-amplification can be from −63 dB to +16 dB.

Figure 2B:
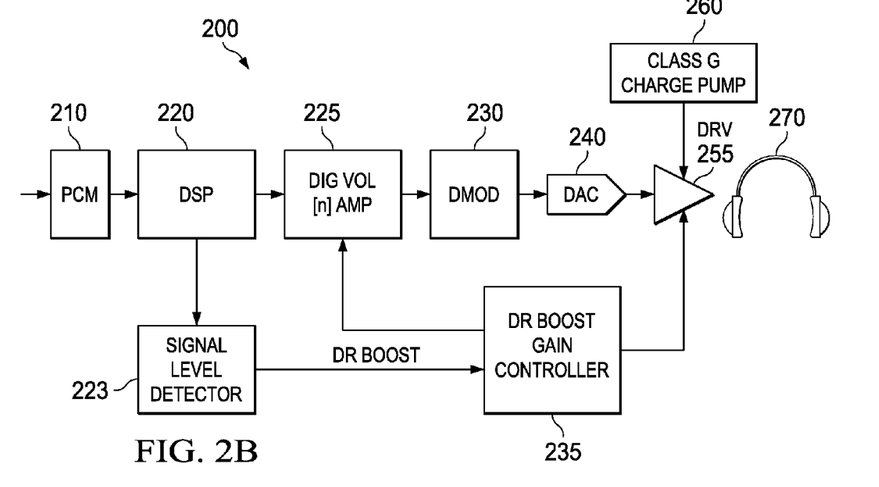
FIG. 2B illustrates a second analysis for dynamic allocation of a digital/analog gain partition of a DAC channel

FIG. 2B illustrates the circuit 200 in more detail. In the circuit 200, a PCM CODEC 210 is coupled to a DSP 220. In one example of the circuit 200, the PCM 210 output bits at a rate of 48 kilo bits per second. The DSP 220 also has a signal level detect 223 coupled to it. The signal level detector detects the actual equivalent volume amplification of the digital signal.

The signal level detect 223 is also coupled to a dynamic range boost gain control 235. The DRBGC 235 is coupled to the digital volume 225 and the driver 255. The DRBDCC 235 allocates, as a function of an output of the signal level detector 235, comparative amplifications between the digital volume 225 and the driver 225.

In the boost mode, when an amplitude at a driver output, such as at a headphone (HP), is under a digital threshold, such as −18 dBFs, a digital gain before the DAC is increased (for example, as high as +12 dB), whereas an analog amplifier/headphone driver gain is reduced to as much as −12 dB. Again, an absolute path gain is unchanged, yet the digital/analog gain portioning is altered. In the circuit 200, the noise of the DSP ramps up less than linearly, so while a gain of a system may be constant, the noise itself is not. In the normal mode, when a signal stabs above the threshold, the digital gain ramps down, and the driver gain ramps up to register settings.

Figure 3:
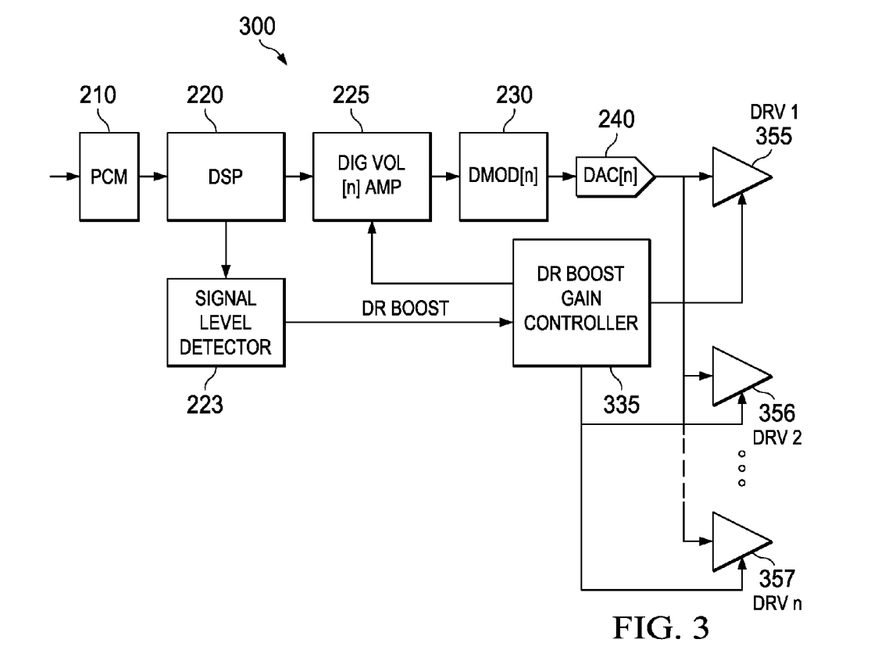
FIG. 3 is an illustration of a usage of a dynamic allocation circuit of FIGS. 2A and 2B with multiple outputs.

FIG. 3 illustrates a part of an integrated circuit 300 that employs of aspects of the circuit 200 in a context of multiple end user amplifiers 355-337. An algorithm for determining how to control the gain of the digital volume amplifier 225 or the amplifier can be embedded within a DR boost gain controller 335.

As an example the DR boost gain controller 335 could be used to enhance the dynamic range of a stereophonic audio channel comprising of separate left and right channels. Another example could be that of a surround sound channel comprising of left, right and a third channel of low frequency commonly known as a sub-woofer channel. The intent of these illustrative examples is to show that the DR boost controller 335 principle is applicable to a plurality of channels concurrently or individually.

Generally, n a further aspect of the present Application as described above regarding FIG. 2A-3, a plurality of different number of thresholds against which the output volume may be compared and consequent gain adjustments can be made is employed. The apparatus 300, described above with single threshold, is hence to be treated as a subset of implementations that could have multiple thresholds.

Figure 4:
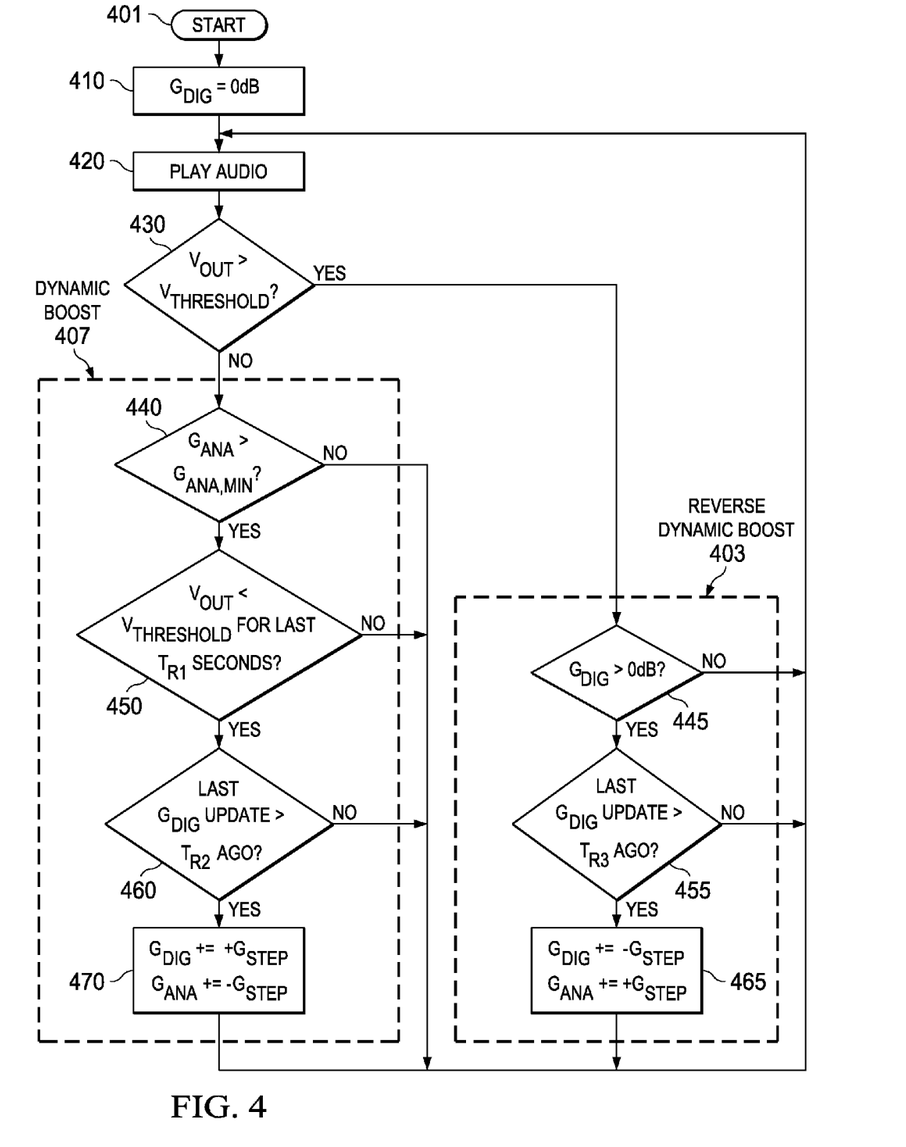
FIG. 4 is an example of a method of using the dynamic allocation circuit of FIGS. 2A and 2B.

FIG. 4 illustrates an example method 400 for determining a dynamic partition of a gain of a digital amplifier, such as the digital amplifier 225, and a gain of a driver such as the driver 255, can be partitioned.

After a start step 401, in a step 410, a gain of the digital amplifier is set to "0."

In a step 420, a command is received that audio is to be played. This command can be received at the PCM 210 of FIG. 2B, for example. The method 400 then advances to a step 430.

In step 430, it is determined whether the overall volume level desired, $V_{out}$, is greater than a $V_{threshold}$, such as −18 dBFs. If yes, the method 400 advances to a normal mode 403 in a step 455. If no, the method 400 advances to a boost mode 407 in a step 440.

In the boost mode 407, in step 440, it is then determined if the gain of the amplifier, such as the amplifier 255, is greater than a minimum gain, such as −12 dB. If not, then step 440 loops back to step 420. However, if the gain of the amplifier is greater than the minimum gain of the amplifier, step 440 advances to step 450.

In step 450, it is determined if the selected $V_{out}$ is less than the $V_{out}$ threshold for less than a certain amount of time, such as 21.2 milliseconds. If not, then step 450 loops back to step 420. However, if the selected $V_{out}$ is less than the $V_{out}$ threshold for less than a certain amount of time, the method advances to step 460. Generally, the amount of delay time in milliseconds is chosen so that the method 400 does not introduce any substantial audible artifacts into the audio signal.

In step 460, it is determined if the last digital gain amplifier update occurred less than a second time period ago, such a 41.66 μs ago. If not, then step 450 loops back to step 420. However, if the last digital gain amplifier update occurred less than a second time period ago then the digital amplifier amplification is increased a dB step gain, such as 2 dB, and the amplifier gain is decreased by 2 db. Step 470 then loops back to step 420. Generally, the amount of gain ramp time in μs is chosen so that the method 400 does not introduce any substantial audible artifacts into the audio signal.

In one aspect, the dynamic boost 407, if an overall threshold volume level is not exceeded, increases a digital gain amplifier and decreases an analog output gain, thereby maintaining the same overall volume. As the threshold volume is not above a certain level, the method 400 saves power on the analog amplifier by changing amplification to the earlier digital amplifier and allowing the analog amplifier to be operated from a lower supply voltage; moreover, as the amplification is below the threshold, this means that the listener will not have a great of an amplification of any previous noise of pops, clicks, etc. from earlier on in an amplification circuit 200.

In the normal mode 403, in, it is determined whether the gain of the digital amplifier is greater than 0 dB. If not, then step 445 loops back to step 420. However, if the gain of the digital amplifier is greater than 0 dB, then step 445 advances to step 455.

Step 455, it is determined whether a last update to the digital amplifier has occurred within a third time period, such as 10 μs. If not, then step 445 loops back to step 420. However, if the last update to the digital amplifier has occurred within a third time period, step 445 advances to a step 465.

In the step 465, the gain of the digital amplifier is decreased by a given amount, such as 2 decibels, and the gain of the analog amplifier is increased by the same given amount, such as 2 decibels. Step 465 than loops back to step 420. According to the principles of the present Application, the step 465 is generally designed to have the amount of increase or decrease in the respective amplifiers substantially equal.

In one aspect, the normal 407, if an overall threshold volume level is exceeded, decreases the gain of a digital gain amplifier and increases an analog output gain, thereby maintaining the same overall volume. As the threshold volume is above a certain level, the method 400 saves power on the analog amplifier by changing amplification to the earlier digital amplifier; moreover, as the amplification is above the threshold, this means that the listener will have a greater tolerance of amplifications of any previous noise of pops, clicks, etc. from earlier on in an amplification circuit 200.

Figure 5A:
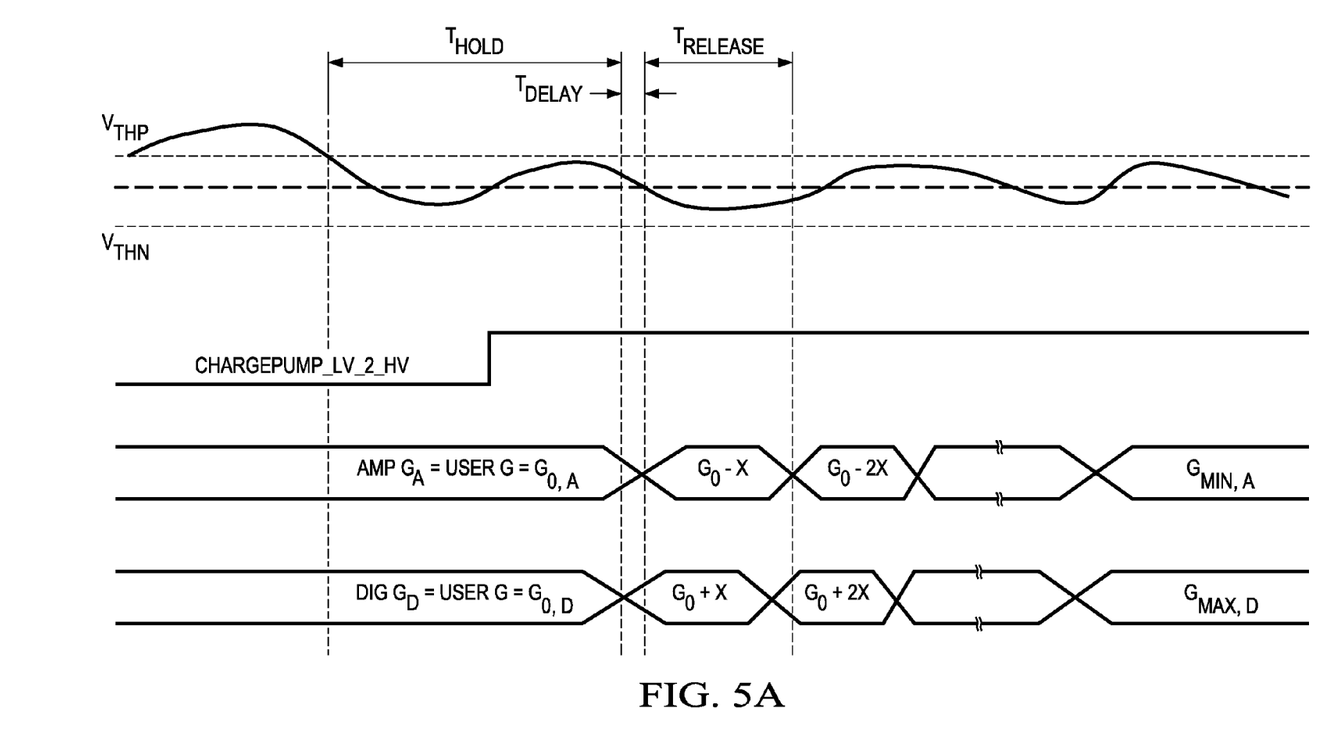
FIG. 5A is a graph of a dynamic digital/analog gain partition of a DAC channel circuit when entering a boost mode.
Figure 5B:
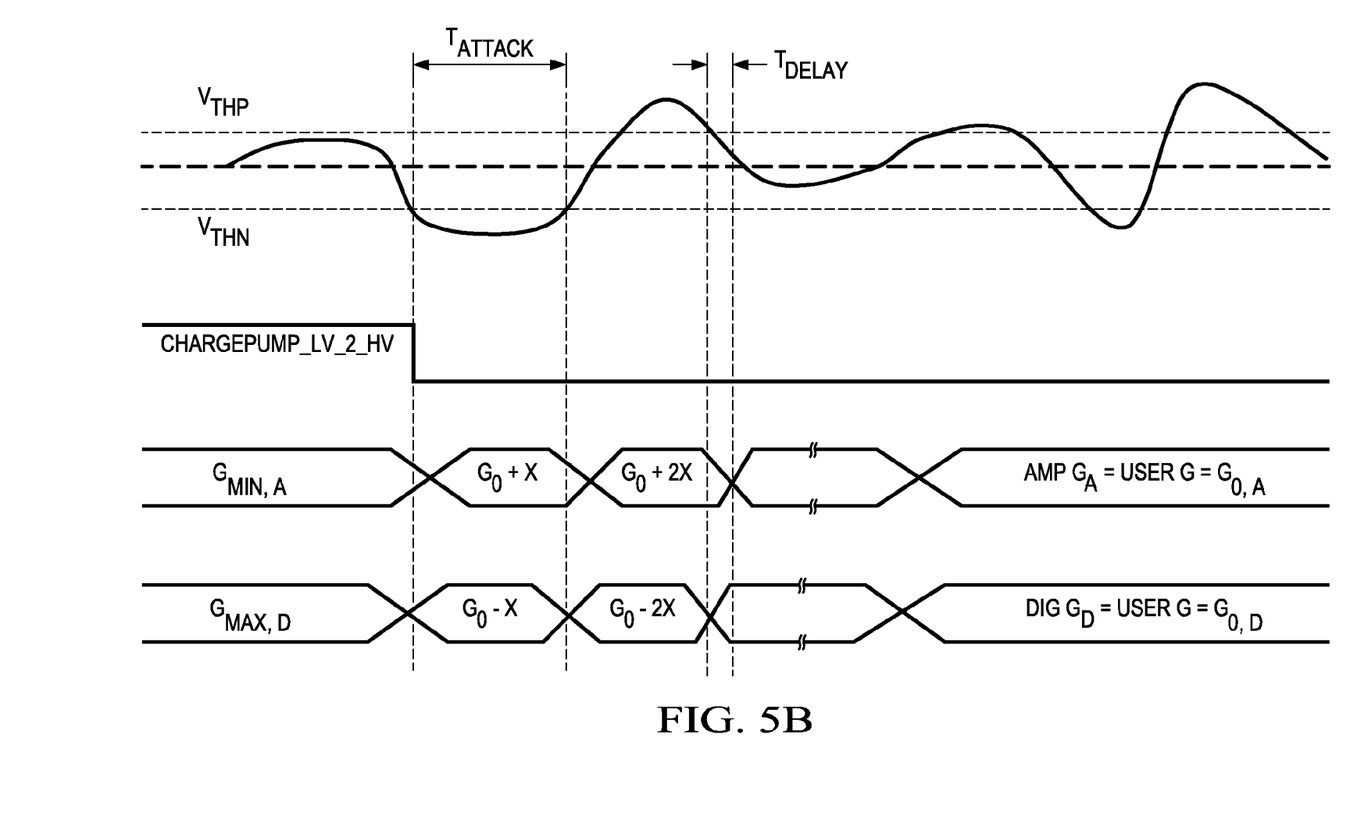
FIG. 5B is a graph of a dynamic digital/analog gain partition of a DAC channel circuit when exiting a boost mode.

The following Table is to be used in conjunction with the timing diagrams of FIG. 5A and FIG. 5B.: The HSLDRV and HSRDRV refer to a stereo amplifier driver combination HS—headset or headphone L/R—left/right DRV—driver:

| Term | Description | Example Values |
|---|---|---|
| VTHP(N) | Voltage threshold for DR Boost Operation | −18 dBFs |
| X | Gain step, analog and digital mismatch < 0.03 dB | 2 dB |
| G0, A | Initial HSDRV gain | 4 dB |
| G0, D | Initial digital gain | 0 dB |

-continued

| Term | Description | Example Values |
|---|---|---|
| GMIN, A | Min HSDRV gain | −12 dB |
| GMAX, D | Max digital gain | +16 dB |
| TDELAY | Digital and HSDRV gain change latency; 9 CLK cycles of DAC_CLK | 2.34 μs |
| TRELEASE | Gain step time when signal is below VTH, Synchronized to frame sync 4 cycles of 96 KHz | 41.6 μs |
| TATTACK | Gain step time when signal is above VTH, Synchronized to frame sync 1 cycle of 96 KHz | 10.6 μs |
| THOLD | Hold time after the signal crosses the threshold; Charge pump (CP) is switched at THOLD/2 | 40 ms |

FIG. 5A illustrates a timing diagram, such as can be used in conjunction with the circuit 200 and the method 400, when the circuit 200 enters the boost mode, such as the boost mode 407.

As is illustrated, the output amplitude crosses below as VTHP threshold level boost level, wherein the 'boost' can be thought of as the digital amplifier boost. To avoid frequent changes in gain, the method defines a wait time to ensure that the signal stays below the pre-defined threshold VTHP for a designated amount of time $T_{hold}$. After completion of designated fraction of this time, $T_{hold}$, a charge pump supply voltage used for the analog output amplifier, such as the class G charge pump 260, is then switched a lower voltage. The use of a lower supply voltage with same or reduced current drawn from the analog output amplifier reduces overall power drawn from the supply. After the time threshold $T_{hold}$. $T_{hold}$ is used, as within boost mode, an analog amplifier gain can then be reduced in steps, and simultaneously a digital amplifier gain can be increased in steps by the DR boost controller using method in FIG. 4.

According to the principles of the present Application, prior to this gain change occurring, the state of the signal CHARGEPUMP_HV_TO_LV is to be altered for further power savings for the apparatus. The signal CHARGEPUMP_HV_TO_LV is set to a logic level '1' implying an asserted signal. This permits the supply to the analog output amplifier to be transitioned safely to a lower output value without danger of undesirable distortion or in the extreme—signal saturation.

It is noted that the principles of the present Application does not rely on the power supply transition just described above to achieve dynamic range enhancement. Thereby the two approaches can be implemented together or separately without prejudice to either approach. If they are implemented together, then the principles of the present Application detailed in this section, and in others below, how the two approaches are to be combined to achieve the twin objectives of dynamic range enhancement and lower power dissipation in a manner that advances prior art.

Then, after a $T_{delay}$, which is a latency period for the digital amplifier and the analog amplifier to be capable of changing their amplifier states, as is illustrated, the AMP signal, wherein the user has an overall amplification level of "G", changes in Go-x, when x is, say 2 decibels, and the digital amplifier increases its output by 2 decibels. This continues in after steps until a minimum level of the amplifier is made, and a maximum digital gain is made. It is to be carefully noted that the supply control for reduced power dissipation and the gain control for enhanced dynamic range are being exercised by the DR boost controller concurrently as stated in the application previously. Typical audio signals have positive and negative swings. Hence VTH=−18 dBFS=|VTHP|=|VTHN| where VTHP=−VTHN to handle audio signals that have positive and negative excursions around 0V.

FIG. 5B illustrates a timing diagram, such as can be used in conjunction with the circuit 200 and the method 400, when the circuit 200 enters a reverse boost mode, such as the reverse boost mode 403.

As is illustrated, the output amplitude crosses as VTH threshold level reverse boost level, wherein the reverse 'boost' can be thought of as the digital amplifier unboost and the amplifier reboost. During this time, $T_{attack}$, the gain of the digital amplifier is decreased by X, say 2 decibels, as the gain of the amplifier is increased by 2 decibels.

After the time threshold $T_{hold}$. $T_{hold}$ is used, as within boost mode, an analog amplifier is powered up, and a digital amplifier is powered down.

Figure 6A:
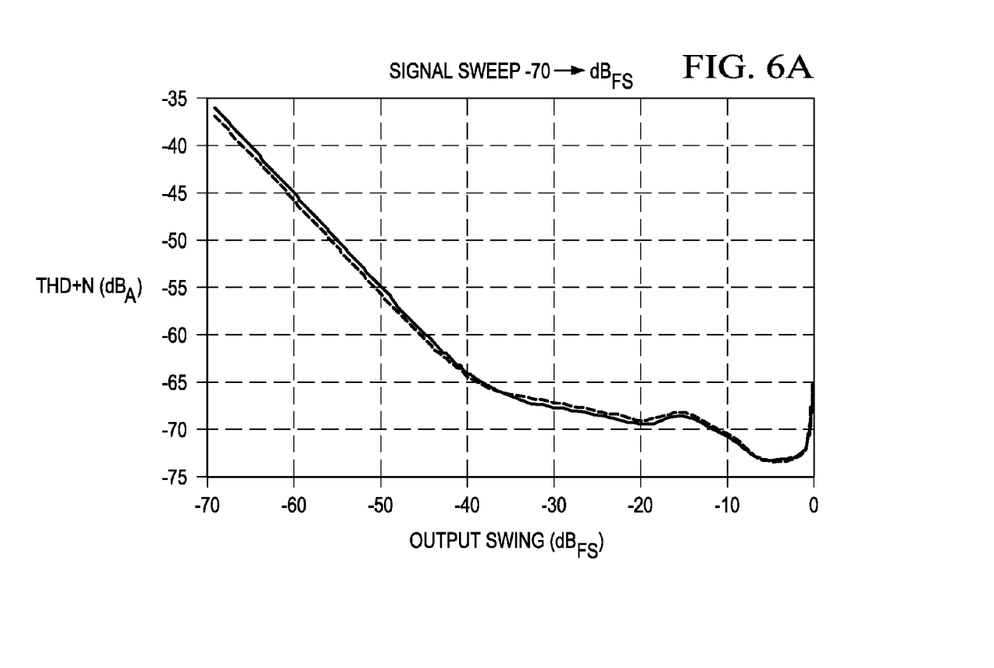
FIG. 6A and FIG. 6B are example silicon results of a dynamic digital/analog gain partition of a DAC channel circuit.

FIG. 6A is an example measurement of the sweep of Signal to Noise+Distortion (SNDR) versus output amplitude showing that a silicon embodiment of the principle and method does not adversely alter the behavior of the channel in its performance relative to prior art while enhancing the signal to noise ratio for signals that conform to the range ≤VTH (example −18 dBFS). The method does not limit the choice of VTH. The use of an example value of −18 dBFS is to illustrate that for a specific situation of interest, greatest enhancement is obtained in the dynamic range of the channel for this choice of VTH. For other situations a different value of VTH may be chosen without prejudice.

Figure 6B:
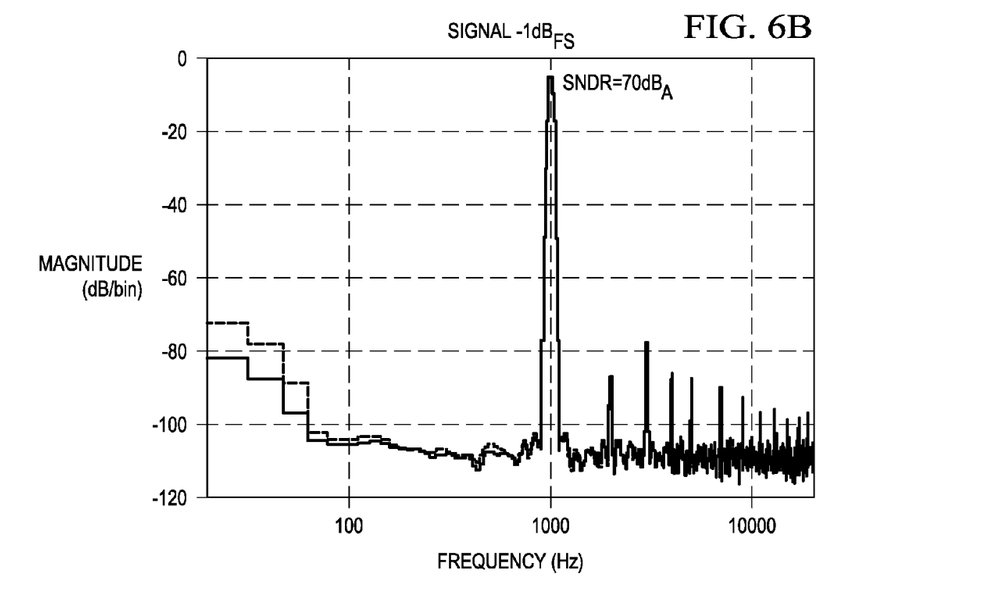
Figure 7A:
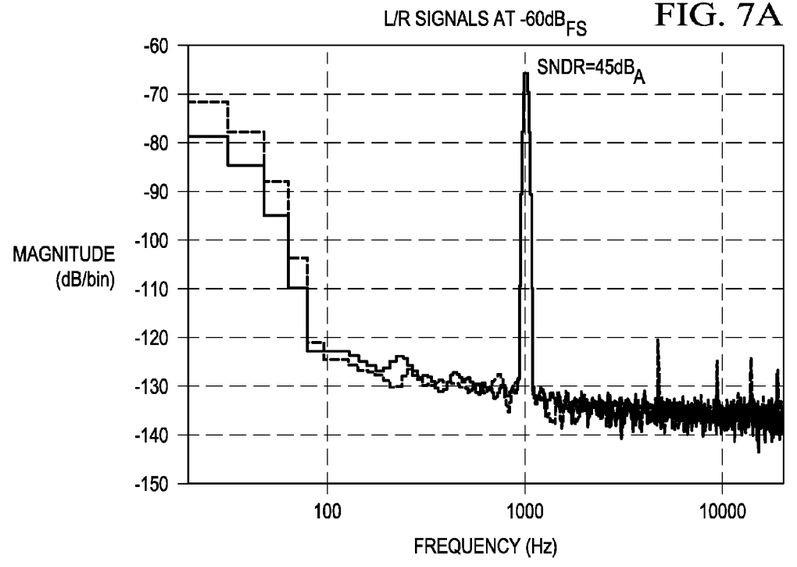
FIG. 7A and FIG. 7B are example silicon results of a dynamic digital/analog gain partition of a DAC channel circuit when applied to a Fast Fourier Transform (FFT)
Figure 7B:
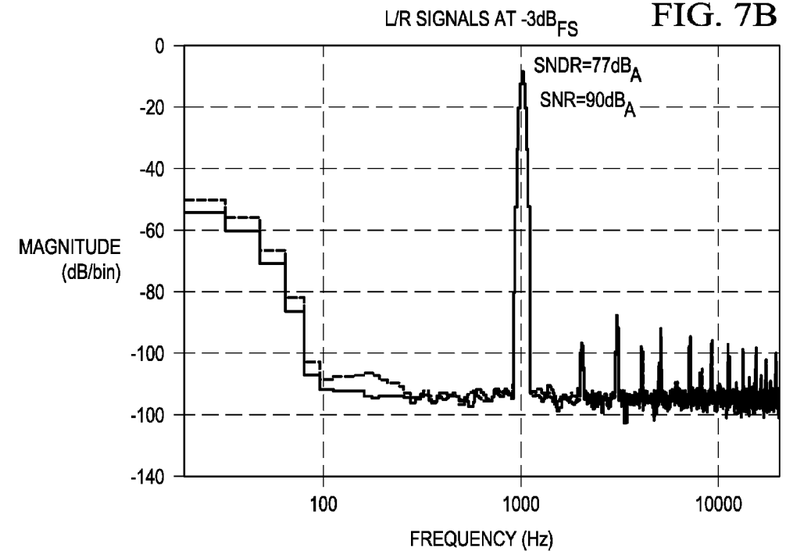

FIGS. 6B, 7A and 7B are examples of Fast Fourier Transforms (FFT) of measured spectra of silicon embodiment of the principle and method showing specific points on the sweep of FIG. 6. These specific points are chosen to be −1 dBFS −3 dBFS and −60 dBFS. At the former level the distortion of the circuit is considered to determine channel performance while at −60dBFS the noise is considered to determine channel performance. It is evident that no adverse effects are observed at −1 dBFS and −3 dBFS as discussed earlier wherein it was alluded to above that the principle does not increase undesirable distortion or introduce audible artifacts. Similarly the beneficial aspects of lower noise as discussed earlier above are clearly seen at −60 dBFS spectrum where the SNDR is measured to be 45 dB. The dynamic range is therefore 60+45=105 dB which is higher than prior art by at least 4 decibels equivalent to a linear figure of 37% lower noise. As stated in the prior art the highest performance claimed for similar class of audio channels is 101 dB.

Figure 8:
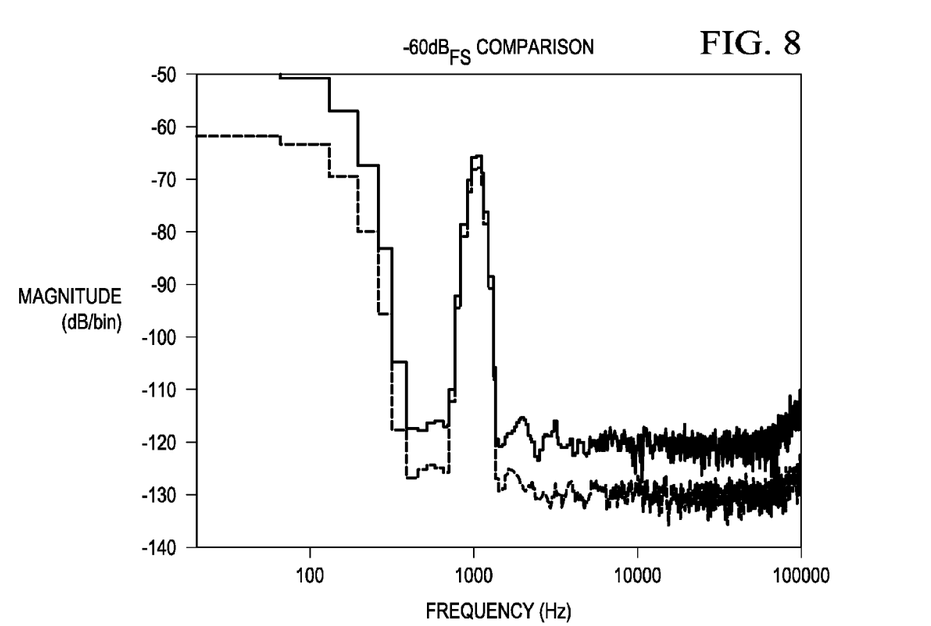
FIG. 8 is a graph of the dynamic range measurement with and without the use of the apparatus described. Industry standard measurements of dynamic range are performed at an output amplitude of −60 dBFS (read as 60 decibels below full scale)

FIG. 8 further reinforces a comparison of prior art with described principle and method where the GREEN curve represents the signal-to-noise (SNR) without applying stated principle and method while the RED curve represents the SNR applying stated principle and method.

Figure 9:
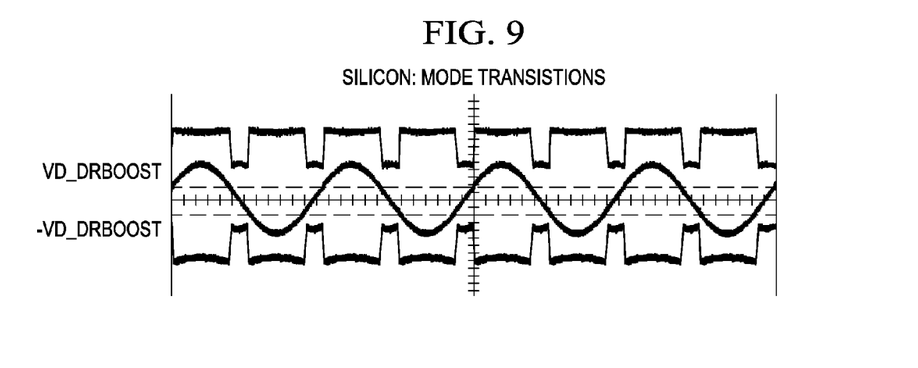
FIG. 9 a graph of how the transition of the signal amplitude above and below the selected volume level of −18 dBFS (read as 18 decibels below full scale) results in changes to the supply voltage level facilitating lower IC power dissipation.

FIG. 9 shows an example output signal as the silicon embodiment transitions between the boost and the reverse boost mode. It is duly noted to those familiar in the art of audio signal amplification and reproduction that the signal shows no obvious audible artifacts as discussed above. The inventors note that the resolution of a plot is finite and not easily amenable to indicate the complete absence of such artifacts whose amplitudes are known to be of very small magnitude. Hence it is noted that the above advantages has been verified by the inventors using quantitative measurement tests and subjective listening tests widely adopted across the field of audio integrated circuits with appropriate test equipment of adequate resolution.

Those skilled in the art to which this application relates will appreciate that other and further additions, deletions, substitutions and modifications may be made to the described embodiments.

What is claimed is:

1. An apparatus, comprising:
a selected volume detector that detects a selected output audio signal volume;
an analog output signal amplifier;
a digital volume amplifier; and
a boost gain control element coupled to
the selected volume detector;
the analog output signal amplifier; and
the digital volume amplifier;
wherein the boost gain control element is configured to:
keep a gain of a path of the digital volume amplifier and the analog output signal amplifier substantially constant, wherein the boost gain control element can adjust both:
a) a gain of the digital volume amplifier; and
b) a gain of the analog output signal amplifier;
to keep the gain of the path of the digital volume amplifier and the analog output signal amplifier substantially constant and equal to the selected output volume, wherein the boost gain control element is further configured to:
compare the selected output volume to a threshold value;
if the selected output volume is below the threshold, then the boost gain control element can:
a) adjust upwards a digital volume of the digital volume amplifier; and
b) adjust downwards a volume of the of an analog output signal amplifier
to keep the gain of the path of the digital volume amplifier and the analog output signal amplifier substantially constant and equal to the selected output volume.

2. The apparatus of claim 1, wherein the boost gain control element is further configured to:
compare the selected volume to a threshold value;
if the given volume of amplitude is above the threshold, then the boost gain control element can:
a) adjust downwards a digital volume of the digital volume amplifier; and
b) adjust upwards a volume of the analog output signal amplifier,
to keep the gain of the path of the digital volume amplifier and the analog output signal amplifier substantially constant and seeks to be equal to the selected output volume.

3. The apparatus of claim 1, further comprising a digital signal processor, wherein an output of the digital signal processor is coupled to an input of the digital volume amplifier.

4. The apparatus of claim 1, wherein the analog output signal amplifier is a "Class G" charge pump.

5. The apparatus of claim 1, wherein the selected volume detector is coupled to a digital signal processor that receives a selected volume signal.

6. The apparatus of claim 1, wherein
a threshold of a boost mode is substantially 18 decibels ("dB") of amplification;
a dynamic range of the digital volume amplifier is an increase of substantially 12 dB; and
a dynamic range of the analog output signal amplifier as adjusted by the boost gain control element is substantially −12 dB.

7. The apparatus of claim 6, wherein there is a transition period between a unity amplification of the digital volume amplifier and a 12 db value, wherein the digital volume amplifier transitions at a substantial 1 dB change.

8. An apparatus, comprising:
a selected volume detector that detects a selected output audio signal volume;
an analog output signal amplifier;
a digital volume amplifier; and
a boost gain control element coupled to
a) the selected volume detector;
b) the analog output signal amplifier; and
c) the digital volume amplifier;
wherein the boost gain control element is configured to:
keep a gain of a path of the digital volume amplifier and the analog output signal amplifier substantially constant,
wherein the boost gain control element can adjust both:
a) a gain of the digital volume amplifier; and
b) a gain of the analog output signal amplifier;
to keep the gain of the path of the digital volume amplifier and the analog output signal amplifier substantially constant and equal to the selected output volume,
wherein the boost gain control element is further configured to:
compare the selected output volume to a threshold value;
if the selected output volume is below the threshold, then the boost gain control element can:
a) adjust upwards a digital volume of the digital volume amplifier; and
b) adjust downwards a volume of the analog output signal amplifier,
to keep the gain of the path of the digital volume amplifier and the analog output signal amplifier substantially constant and equal to the selected output volume.

9. The apparatus of claim 8, wherein the boost gain control element is further configured to:
compare the selected volume to a threshold value;
if the given volume of amplitude is above the threshold, then the boost gain control element can:
a) adjust downwards a digital volume of the digital volume amplifier; and
b) adjust upwards a volume of the analog output signal amplifier,
to keep the gain of the path of the digital volume amplifier and the analog output signal amplifier substantially constant and equal to the selected output volume.

10. The apparatus of claim 8, further comprising a digital signal processor, wherein an output of the digital signal processor is coupled to an input of the digital volume amplifier.

11. The apparatus of claim 8, wherein the analog output signal amplifier is a "Class G" charge pump.

12. The apparatus of claim 8, wherein the selected volume detector is coupled to a digital signal processor that receives a selected volume signal.

13. A method, comprising:
determining if a selected audio output volume is greater than a volume threshold;
increasing a gain of a digital amplifier if the selected output volume is not greater than the threshold volume;
decreasing a gain of an analog output signal amplifier if the selected output volume is not greater than the threshold volume; and
wherein the gain of a path of the digital amplifier and the analog output signal amplifier is substantially constant and seeks to be equal to the selected output volume.

14. The method of claim 13, further comprising:
playing an audio stream at the selected output volume.

15. The method of claim 13, further comprising:
determining if a gain of the digital amplifier is greater than an allowable gain of the digital amplifier if the selected output volume is not greater than the volume threshold.

16. The method of claim 13, further comprising
determining if the selected output volume is less than the volume threshold for a first time lapse; and
determining if an update of of at least one of the digital amplifier and the analog output signal amplifier occurred within a second time lapse ago.

17. The method of claim 13, wherein the selected output volume is generated with aid of an "Class G" charge pump.

18. The method of claim 17, further comprising:
playing an audio stream at the selected output volume.

* * * * *